United States Patent
Cheng et al.

(10) Patent No.: US 7,642,588 B2
(45) Date of Patent: Jan. 5, 2010

(54) MEMORY CELLS WITH PLANAR FETS AND VERTICAL FETS WITH A REGION ONLY IN UPPER REGION OF A TRENCH AND METHODS OF MAKING AND USING SAME

(75) Inventors: Kangguo Cheng, Beacon, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 11/259,296

(22) Filed: Oct. 26, 2005

(65) Prior Publication Data

US 2007/0090393 A1    Apr. 26, 2007

(51) Int. Cl.
*H01L 27/108* (2006.01)
(52) U.S. Cl. ............... 257/302; 257/330; 257/E27.096; 257/E29.262
(58) Field of Classification Search ......... 257/300–302, 257/330–332, 905, E27.096, E29.262
See application file for complete search history.

(56) References Cited

U.S. PATENT DOCUMENTS

| | | | |
|---|---|---|---|
| 4,763,181 A * | 8/1988 | Tasch, Jr. ..................... 257/300 |
| 4,914,740 A * | 4/1990 | Kenney ....................... 257/300 |
| 5,554,870 A * | 9/1996 | Fitch et al. .................. 257/334 |
| 5,732,014 A | 3/1998 | Forbes |
| 5,828,100 A * | 10/1998 | Tamba et al. ................. 257/328 |
| 5,897,351 A | 4/1999 | Forbes |
| 6,043,527 A * | 3/2000 | Forbes ........................ 257/296 |
| 6,333,532 B1 * | 12/2001 | Davari et al. ................. 257/301 |
| 6,339,241 B1 * | 1/2002 | Mandelman et al. ......... 257/301 |
| 6,680,864 B2 | 1/2004 | Noble |
| 6,747,890 B1 | 6/2004 | Kirihata et al. |
| 6,756,622 B2 | 6/2004 | Noble |
| 6,800,927 B2 * | 10/2004 | Noble et al. ................. 257/628 |
| 2004/0195618 A1 * | 10/2004 | Saito et al. ................... 257/330 |

OTHER PUBLICATIONS

"Process for Making a Two-Device Non-Destructive Memory Cell in a Three-Dimensional Structure", IBM Technicall Disclosure Bulleting vol. 28, Issue 12, May 1, 1986, pp. 5164-5165.*
U. Gruening et al., "A Novel Trench DRAM Cell with a VERtIcal Access Transistor and BuriEd STrap (VERI BEST) for 4Gb/16GB," 1999 IEEE, 0-7803-5410-9/99.
R. Weis et al., "A Highly Cost Efficient 8F² DRAM Cell with a Double Gate Vertical Transistor Device for 100 nm and Beyond," 2001 IEEE, 0-7803-7050-3/01.

(Continued)

*Primary Examiner*—David Vu
*Assistant Examiner*—Earl N Taylor
(74) *Attorney, Agent, or Firm*—Dugan & Dugan, PC

(57) ABSTRACT

In a first aspect, a first apparatus is provided. The first apparatus is a memory cell of a substrate that includes (1) a PFET with an orientation approximately planar to a surface of the substrate; and (2) an NFET coupled to the approximately planar PFET. An orientation of the NFET in the substrate is approximately perpendicular to the orientation of the PFET. Numerous other aspects are provided.

16 Claims, 10 Drawing Sheets

OTHER PUBLICATIONS

Gruening, U. et al., "A Novel Trench DRAM Cell with a VERtIcal Access Transistor and BuriEd STrap (VERI BEST) for 4Gb/16Gb", Sep. 1999, IEEE, pp. 2.1.1-2.1.4.

Weis, R. et al., "A Highly Cost Efficient 8F2 DRAM Cell with a Double Gate Vertical Transistor Device for 100 nm and Beyond", Mar. 2001, IEEE, pp. 18.7.1-18.7.4.

* cited by examiner

US 7,642,588 B2

MEMORY CELLS WITH PLANAR FETS AND VERTICAL FETS WITH A REGION ONLY IN UPPER REGION OF A TRENCH AND METHODS OF MAKING AND USING SAME

FIELD OF THE INVENTION

The present invention relates generally to memory, and more particularly to gain cells and methods of making and using the same.

BACKGROUND

One conventional memory element (e.g., a gain cell) may include a planar p-channel metal oxide semiconductor field effect transistor (PFET) coupled to a planar n-channel metal oxide semiconductor field effect transistor (NFET). However, such an orientation of transistors may inefficiently use chip space. Another conventional gain cell may include a vertical NFET coupled to a junction field effect transistor (JFET). However, such a gain cell may require a complex fabrication process. Accordingly, improved gain cells and methods of making and using the same are desired.

SUMMARY OF THE INVENTION

In a first aspect of the invention, a first apparatus is provided. The first apparatus is a memory cell of a substrate that includes (1) a PFET with an orientation approximately planar to a surface of the substrate; and (2) an NFET coupled to the approximately planar PFET. An orientation of the NFET in the substrate is approximately perpendicular to the orientation of the PFET.

In a second aspect of the invention, a first system is provided. The first system is a memory array that includes (1) a first memory cell of a substrate; and (2) a second memory cell of the substrate coupled to the first memory cell. Each of the first and second memory cells have (a) a PFET with an orientation approximately planar to a surface of the substrate; and (b) an NFET coupled to the approximately planar PFET. An orientation of the NFET is approximately perpendicular to the orientation of the PFET.

In a third aspect of the invention, a first method of manufacturing a memory cell is provided. The first method of manufacturing the memory cell includes the steps of (1) providing a substrate; (2) forming a PFET with an orientation approximately planar to a surface of the substrate; and (3) forming an NFET coupled to the approximately planar PFET. An orientation of the NFET in the substrate is approximately perpendicular to the orientation of the PFET.

In a fourth aspect of the invention, a first method of accessing data in a memory cell is provided. The first method of accessing data in the memory cell includes the steps of (1) providing a memory cell having (a) a PFET with an orientation approximately planar to a surface of the substrate; (b) an NFET coupled to the approximately planar PFET; and (c) a capacitor coupled between the PFET and NFET, wherein an orientation of the NFET in the substrate is approximately perpendicular to the orientation of the PFET; and (2) at least one of reading data from the cell by determining a current through the PFET and writing data to the cell by affecting a voltage stored by the capacitor. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides an improved memory element or cell (e.g., gain cell) and method of manufacturing and using the same. The improved gain cell may efficiently consume substrate space. For example, a gain cell in accordance with an embodiment of the present invention may include a vertical NFET coupled to a planar PFET via a capacitor, such as a substrate-plate trench type capacitor. More specifically, a source/drain diffusion region of the vertical NFET and an n-well of the planar PFET may be coupled to a storage node of the capacitor. Therefore, a voltage across the storage capacitor may determine the threshold voltage of the PFET. Consequently, a value stored by the gain cell may be determined by sensing a current through the PFET. The present invention also includes methods of manufacturing the improved gain cell.

Figure 1:
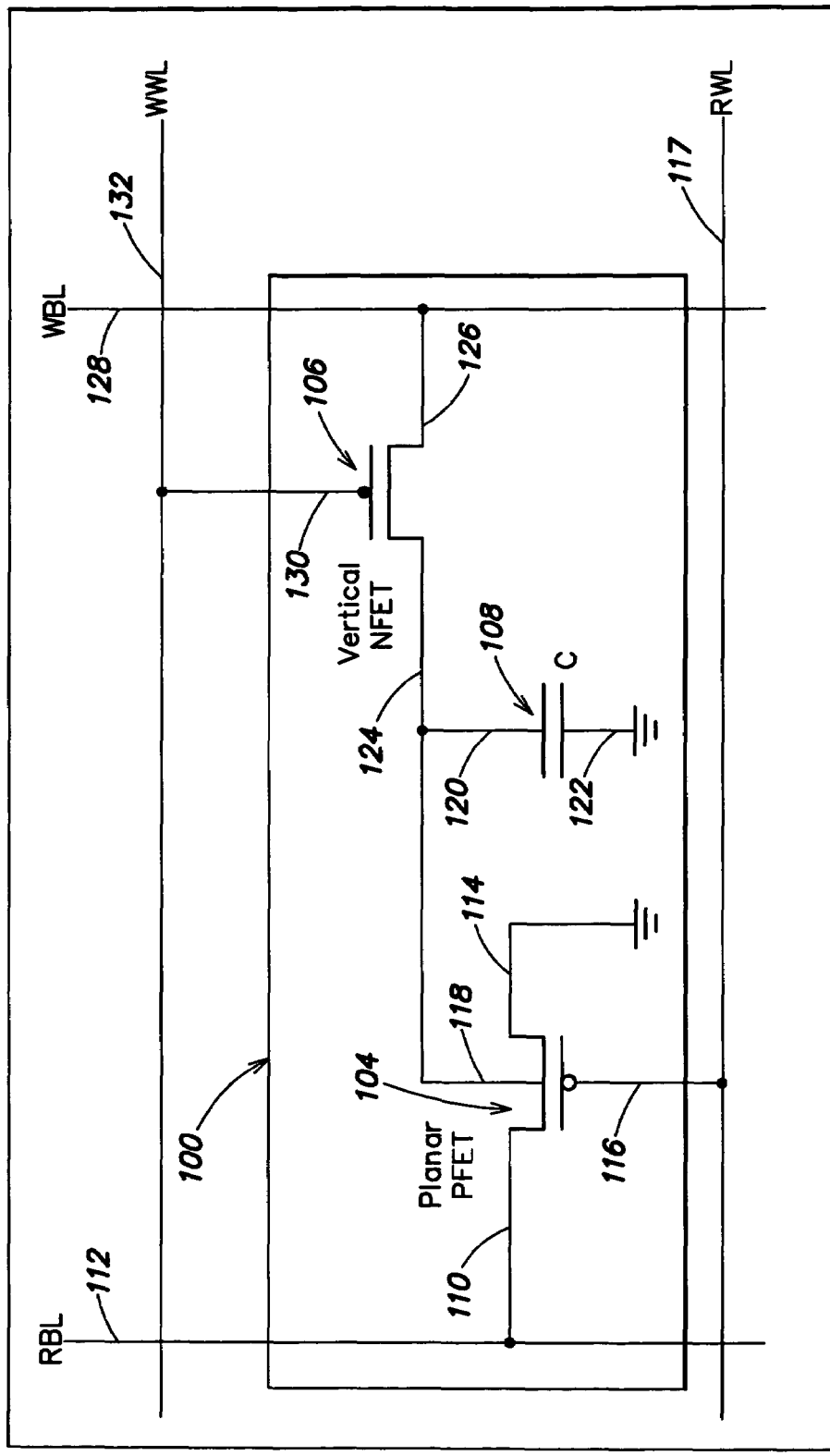
FIG. 1 is a schematic view of a memory cell in accordance with an embodiment of the present invention.

FIG. 1 is a schematic view of a memory cell 100 in accordance with an embodiment of the present invention. With reference to FIG. 1, the memory cell 100 (e.g., gain cell) may include a plurality of transistors formed in a substrate 102. For example, the memory cell 100 may include a p-channel metal oxide semiconductor field effect transistor (PFET) 104 coupled to an n-channel metal oxide semiconductor field effect transistor (NFET) 106. As illustrated below with reference to FIG. 3, the orientation of the PFET 104 in the substrate 102 may be approximately planar with a surface of the substrate 102. Additionally, the orientation of the NFET 106 may be approximately perpendicular to the orientation of the PFET 104. Further, the memory cell 100 may include a capacitor 108 coupled between the PFET 104 and NFET 106. A value stored by the memory cell 100 may be based on a voltage stored by the capacitor 108.

More specifically, a source or drain terminal 110 of the PFET 104 may couple to a first bit line (e.g., a read bit line (RBL)) 112 coupled to the memory cell 100, and a drain or source terminal 114 of the PFET 104 may coupled to a voltage of a low logic state (e.g., such as ground). Further, a gate terminal 116 of the PFET 104 may be couple to a first word line (e.g., a read word line (RWL)) 117 coupled to the memory cell 100.

The PFET 104 may couple (e.g., via a body terminal 118) to the capacitor 108 (e.g., via a first electrode 120 thereof). A second electrode 122 of the capacitor 108 may couple to a low logic state (e.g., such as ground).

Similar to the first electrode 120 of the capacitor 108, a source or drain terminal 124 of the NFET 106 may couple to the body terminal 118 of the PFET 104. Further, a drain or source terminal 126 of the NFET 106 may couple to a second bit line (e.g., a write bit line (WBL)) 128 and a gate terminal 130 of the NFET 106 may couple to a second word line (e.g., a write word line (WWL)) 132.

In this manner, the memory cell 100 in accordance with an embodiment may include a PFET 104 with an orientation approximately planar to a surface of the substrate 102, an NFET 106 with an orientation in the substrate 102 approximately perpendicular to that of the PFET 104 (e.g., a vertical orientation) and a capacitor 108 coupled between the PFET 104 and NFET 106. The memory cell 100 may include separate read and write access lines, such as a read word line (RWL) 117 and a write word line (WWL) 132.

Figure 2:
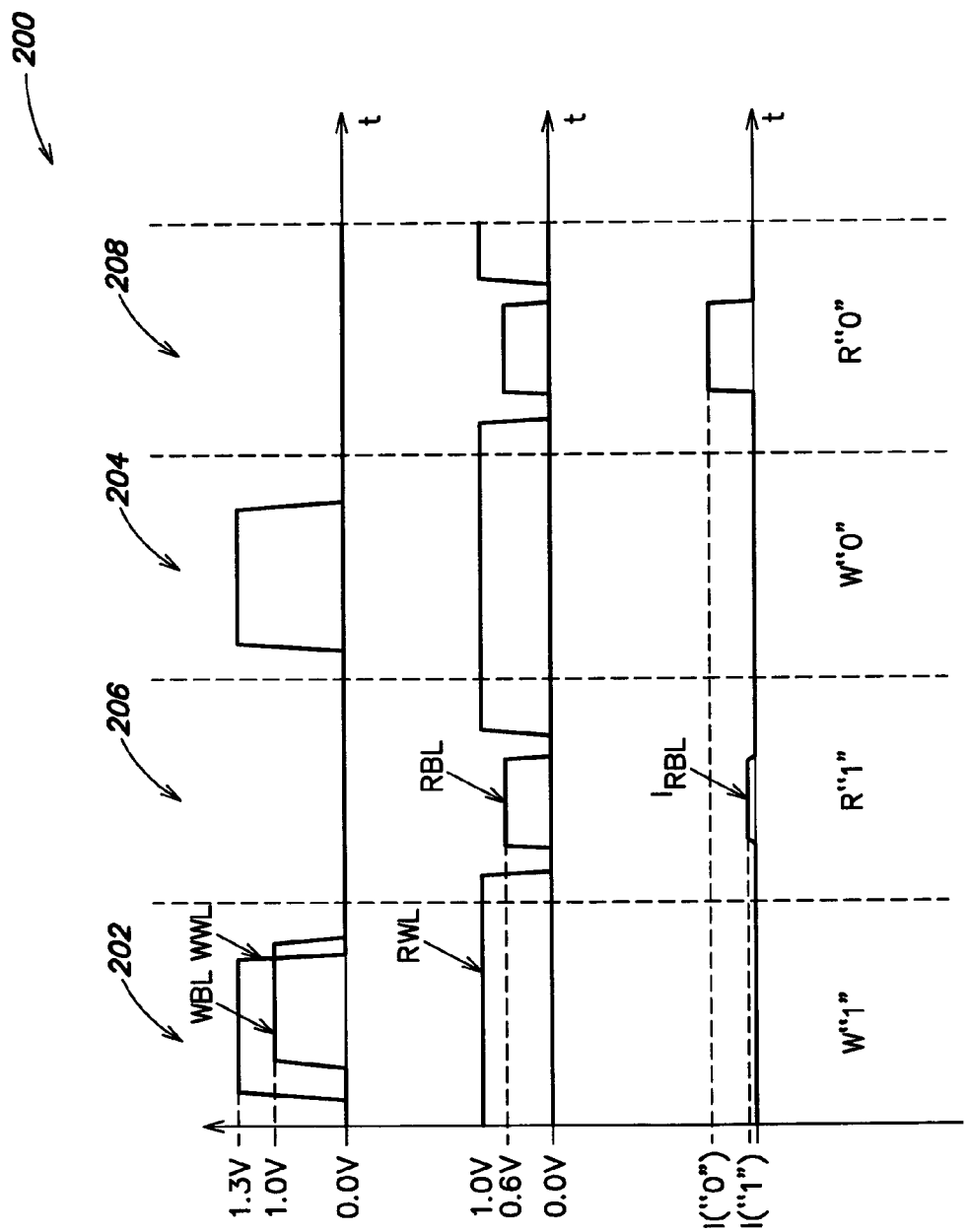
FIG. 2 is an exemplary timing diagram illustrating how data is read from and written to the memory cell of FIG. 1 in accordance with an embodiment of the present invention.

The operation of the memory cell 100 is now described with reference to FIG. 1 and with reference to FIG. 2 which is an exemplary timing diagram 200 illustrating how data is read from and written to the memory cell 100 of FIG. 1 in accordance with an embodiment of the present invention. With reference to FIG. 2, a first portion 202 of the timing diagram 200 may illustrate a state of a signal (e.g., voltage) on the first word line RWL 117, first bit line RBL 112, second word line WWL 132 and second bit line WBL 128 when writing a value of a high logic state (e.g., a logic "1") in the memory cell 100. Similarly, a second portion 204 of the timing diagram 200 may illustrate a state of a signal (e.g., voltage) on the first word line RWL 117, first bit line RBL 112, second word line WWL 132 and second bit line WBL 128 when writing a value of a low logic state (e.g., a logic "0") in the memory cell 100. Additionally, a third portion 206 of the timing diagram 200 may illustrate a state of a signal (e.g., voltage) on the first word line RWL 117, first bit line RBL 112, second word line WWL 132 and second bit line WBL 128 when reading a value of a high logic state (e.g., a logic "1") from the memory cell 100. Further, the third portion 206 of the timing diagram 200 illustrates a current $I_{RBL}$ through the PFET 104 when reading the value of the high logic state from the memory cell 100. Similarly, a fourth portion 208 of the timing diagram 200 may illustrate a state of a signal on the first word line RWL 117, first bit line RBL 112, second word line WWL 132 and second bit line WBL 128 when reading a value of a low logic state (e.g., a logic "0") from the memory cell 100. Further, the fourth portion 208 of the timing diagram 200 may illustrate a current $I_{RBL}$ through the PFET 104 when reading the value of the low logic state from the memory cell 100. It should be noted that the current through the PFET 104 when a value of a high logic state is read from the memory cell 100 may be smaller than the current through the PFET 104 when a value of a low logic state is read from the memory cell 100 (although different relative voltages may be employed).

In some embodiments, a voltage on the first bit line RBL 112 may swing from about 0.0 V to about 0.6 V, a voltage on the second bit line WBL 128 may swing from about 0.0 V to about 1.0 V and a voltage on the second word line WWL may swing from about 0.0 V to about 1.3 V. However, the voltage swing on RBL, WBL and/or WWL may be larger or smaller and/or different. Additionally, in some embodiments, to reduce and/or eliminate a forward bias of the PFET 104 (e.g., a forward bias of a junction of an n-well region/p+ region of the PFET 104 (described below)) a voltage stored by the capacitor 108 may swing from about 0.0 V to about 0.6 V (although a larger or smaller and/or different voltage swing may be employed). In some embodiments, a resting state (e.g., standby voltage) of WBL 128, WWL 132 and RBL 112 may be of a low logic state, and the resting state of RWL 117 may be of a high logic state. However, different resting states may be employed for WBL 128, WWL 132, RBL 112 and/or RWL 117.

As shown by the first and second portions 202, 204 of the timing diagram 200, data may be written to the memory cell 100 by transferring charge between the WBL 128 and the storage capacitor 108 by raising a voltage the WWL 132. For example, if, as described above, a voltage on the WBL 128 is allowed to swing between about 0.0 V and about 1.0 V and a voltage on the WWL 132 is ramped from about 0.0 V to about 1.3 V. It should be noted that a threshold voltage of about 0.7 V may be required for the NFET 106 to assure a sufficiently low off-state leakage. Therefore, when a voltage on the WWL 132 is boosted to about 1.3 V, about 0.6 V may be written to (e.g., stored by) the storage capacitor 108. The voltage stored by the capacitor 108 may be applied to the n-well region of the planar PFET 104 thereby modulating a threshold voltage of the PFET 104. The n-well region may not become negative with respect to ground. Therefore, the n-well region and source-drain diffusion junction of the PFET 104 may not be forward biased while the RBL 112 is in a resting state.

As shown by the third and fourth portions 206, 208 of the timing diagram 200, the data may be read from the memory cell 100 by deasserting a voltage on the RWL 117 and asserting a voltage no higher than about 0.6 V on the RBL 112. Although some forward biasing of a source-drain diffusion and n-well region junction may be allowed while the voltage is asserted on the RBL 112, using such voltage may prevent a strong forward bias of the PFET junction from occurring (e.g., even when the capacitor 108 stores about 0.0 V). Since a threshold voltage of the PFET 104 may be dependent upon a bias of the N-well, a current may be sensed in the RBL 112 (e.g., and through the PFET 104) to determine a state (e.g., voltage) stored by the capacitor 108.

Figure 3:
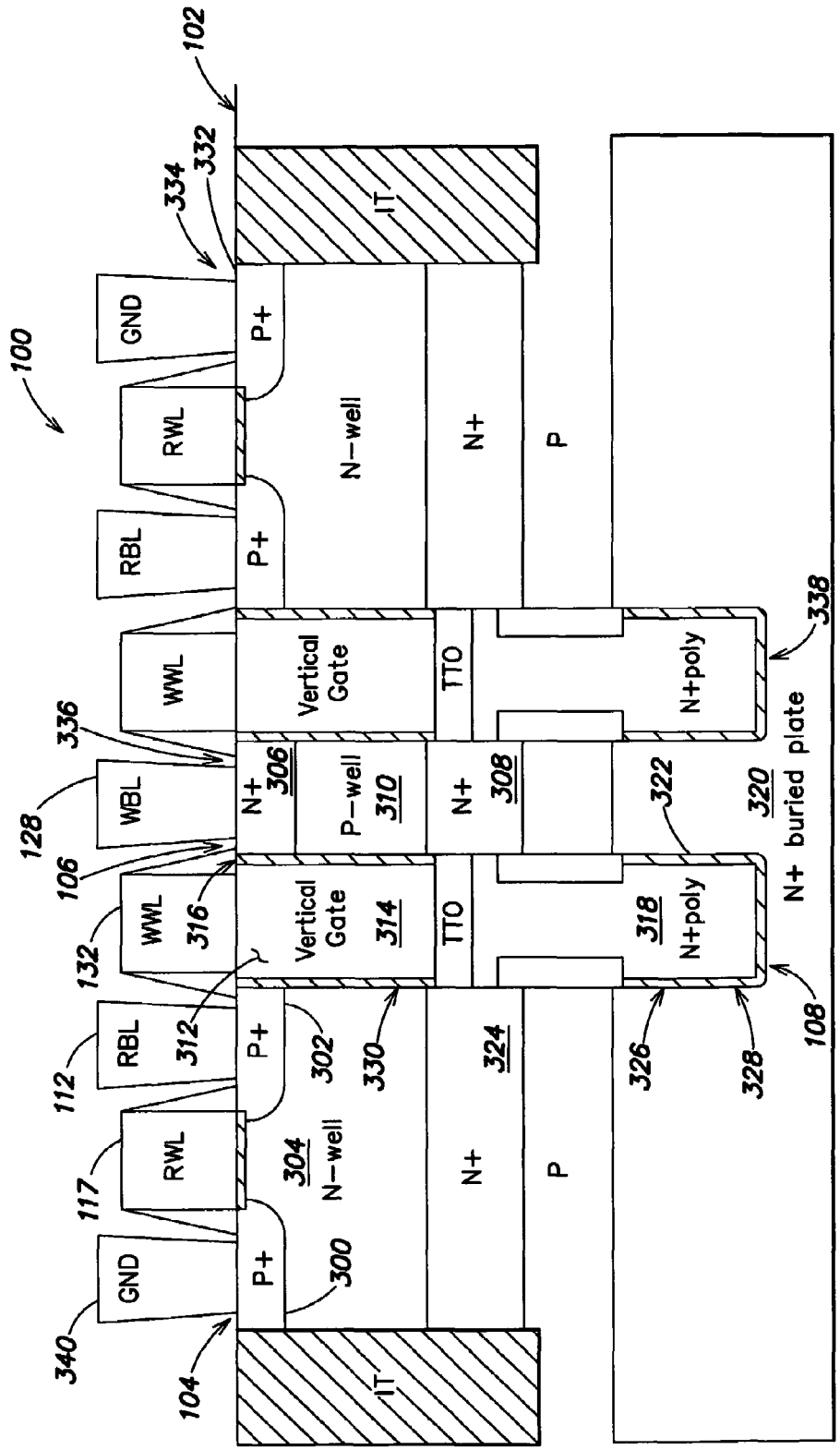
FIG. 3 illustrates a cross-sectional side view of the memory cell in accordance with an embodiment of the present invention.

FIG. 3 illustrates a cross-sectional side view of the memory cell 100 in accordance with an embodiment of the present invention. With reference to FIG. 3, the memory cell 100 may include a PFET 104 coupled to an NFET 106 via a capacitor 108. The PFET 104 may include a first p+ region 300 coupled to a second p+ region 302 via an electrically conductive region 304 (e.g., an isolated n-well region). Further, the NFET 106 may include a first source/drain diffusion region (e.g., n+ region) 306 coupled to a second source/drain diffusion region 308 via a p-well region 310. The NFET 106 may include gate conductor material 312 forming a gate conductor region 314 coupled to the source/drain diffusion and p-well regions 306, 308, 310 via a dielectric region 316.

The memory cell 100 may include a capacitor 108 coupled between the PFET 104 and NFET 106. More specifically, the capacitor 108 may include a first region (e.g., an n+ poly region 318) coupled to a second region (e.g., an n+ buried plate 320) via a dielectric region 322. The second source/drain diffusion region 308 of the NFET 106 may be coupled to the n+ poly region 318 of the capacitor 108. The n+ poly region 318 of the capacitor 108 may be coupled to the electrically conductive region 304 of the PFET 104 via an N+ region or band 324 of the memory cell.

The memory cell 100 may include one or more trenches 326 each having a first region 328 and a second region 330. One or more portions of the capacitor 108 may be formed in the first region 328 of the trench 326. Similarly, one or more portions of the NFET 104 may be formed in the second region 330 of the trench 326. Consequently, as shown, the orientation of the PFET 104 may be approximately planar to a surface 332 of the substrate 102 and the orientation of the NFET 106 may be approximately perpendicular to that of the PFET 104.

A first PFET 104 coupled to a first NFET 106 via a first capacitor 108 is described above. However, in some embodiments, it should be noted that the memory cell 100 may symmetrically include a second PFET 334 coupled to a second NFET 336 via a second capacitor 338.

The memory cell 100 may include wiring such as a ground bus (GND) 340, the first word line (RWL) 117, the first bit line (RBL) 112, the second word line (WWL) 132 and the second bit line (WBL) 128. For example, GND 340 may couple to the first source/drain region 300 of the PFET 104, RWL 117 may couple to the n-well of the PFET 104, RBL 112 may couple to a second source/drain region 302 of the PFET 104. Further, WWL 132 may couple to the gate conductor region 314 of the NFET 106 and WBL 128 may couple to the first source/drain region 306 of the NFET 106.

Figure 4:
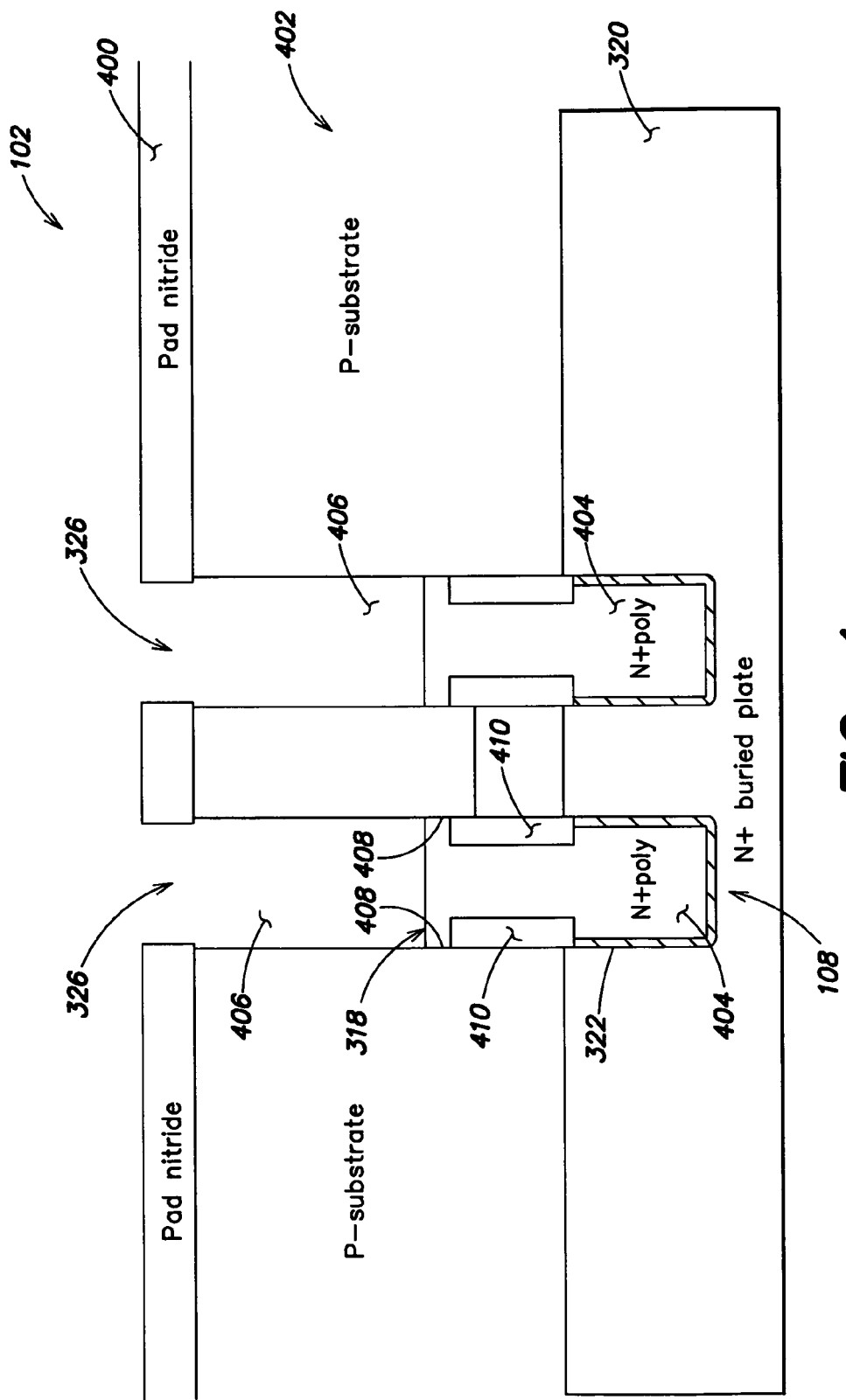
FIG. 4 illustrates a cross-sectional side view of a substrate following a step of an exemplary method of forming the memory cell on the substrate in which a substrate-plate trench type capacitor is formed in accordance with an embodiment of the present invention.

The manufacture of the memory cell 100 is now described with reference to FIGS. 1-3 and with reference to FIGS. 4-8 which illustrate an exemplary method of forming the memory cell 100. More specifically, FIG. 4 illustrates a cross-sectional side view of the substrate following a step of an exemplary method of forming the memory cell 100 on a substrate 102 in which a substrate-plate trench type capacitor is formed in accordance with an embodiment of the present invention. With reference to FIG. 4, a substrate 102 (e.g., a p-type substrate) including a [001] crystal orientation, such as a monocrystalline silicon substrate, may be employed (although a substrate 102 having a different crystal orientation may be employed). Chemical vapor deposition (CVD) or another suitable method may be employed to form a pad nitride layer 400 on the substrate 102. The pad nitride layer 400 may be about 50 nm to about 300 nm thick (although a larger or smaller and/or different thickness range may be employed). In some embodiments, thermal oxidation or another suitable method may be employed to form a thermal oxide layer on the substrate 102 before the pad nitride layer 400 is formed. In such embodiments, the thermal oxide layer may be about 1 nm to about 10 nm thick (although a larger or smaller and/or different thickness range may be employed).

CVD or another suitable method may be employed to form a pad oxide layer on the substrate 102. The pad oxide layer may have a thickness of about 50 nm to about 500 nm (although a larger or smaller and/or different thickness range may be employed). The pad oxide layer may serve as an oxide mask (e.g., a hard mask). A patterned photoresist layer or another suitable method may be employed to pattern the oxide mask. Thereafter, RIE or another suitable method may be employed to remove portions of the pad nitride layer 400 and monocrystalline silicon 402. In this manner, one or more trenches 326 having a first region (e.g., bottom region 404) and a second region (e.g., top region 406) may be formed in the substrate 102. The trenches may be deep, for example, about 2 μm to about 6 μm deep (although a larger or smaller and/or different depth range may be employed). Additionally, the RIE or another suitable method may be employed to remove a substantial amount (e.g., all) of the oxide mask overlying the pad nitride layer 400.

Thereafter, outdiffusion from a doped solid source coating, such as doped glass, or another suitable method may be employed to form an n+ buried-plate diffusion region 320 of the substrate 102. For example, the n+ buried-plate diffusion region 320 may be formed around the bottom region 404 of the one or more trenches 326. CVD, chemical reaction with an exposed trench sidewall in the substrate 102, or other suitable methods may be employed to form a dielectric (e.g., capacitor dielectric) 322 in the lower region of the trench 404. The capacitor dielectric 322 may be about 3 nm to about 10 nm thick (although a larger or smaller and/or different thickness range may be employed). The capacitor dielectric 322 may be formed from silicon oxide, silicon nitride, silicon oxynitride, high-K dielectric and/or one or more other suitable materials. CVD or another suitable material may be employed to fill the trench 326 (e.g., a lower region 404 thereof) with n+ polysilicon or another suitable conductive material. Chemical mechanical planarization (CMP) or another suitable method may be employed to planarize a top surface of the n+ polysilicon region. Thereafter, RIE or another suitable method may be employed to form a recess in the n+ polysilicon region.

CVD or another suitable method be employed to form an oxide region along one or more sidewalls 408 of the trenches 326. The oxide regions 410 may serve as collar isolation oxide regions 410, which may suppress a parasitic current of a transistor subsequently formed in the substrate 102.

In a manner similar to that described above, CVD or another suitable method may be employed to deposit additional n+ polysilicon or another suitable conductive material in the lower region 404 of the trenches 326. Thereafter, such material may be planarized and recessed. In this manner, an n+ polysilicon region 318 may be formed. The additional n+ polysilicon or another suitable conductive material may be recessed a depth such that a top surface of the n+ polysilicon region 318 may extend above the collar isolation oxide regions 410 by about 10 nm to about 50 nm (although the n+ polysilicon material may be recessed deeper or shallower). In this manner, the n+ buried-plate diffusion region 320, capacitor dielectric 322 and n+ polysilicon region 318 may form the capacitor 108.

Figure 5:
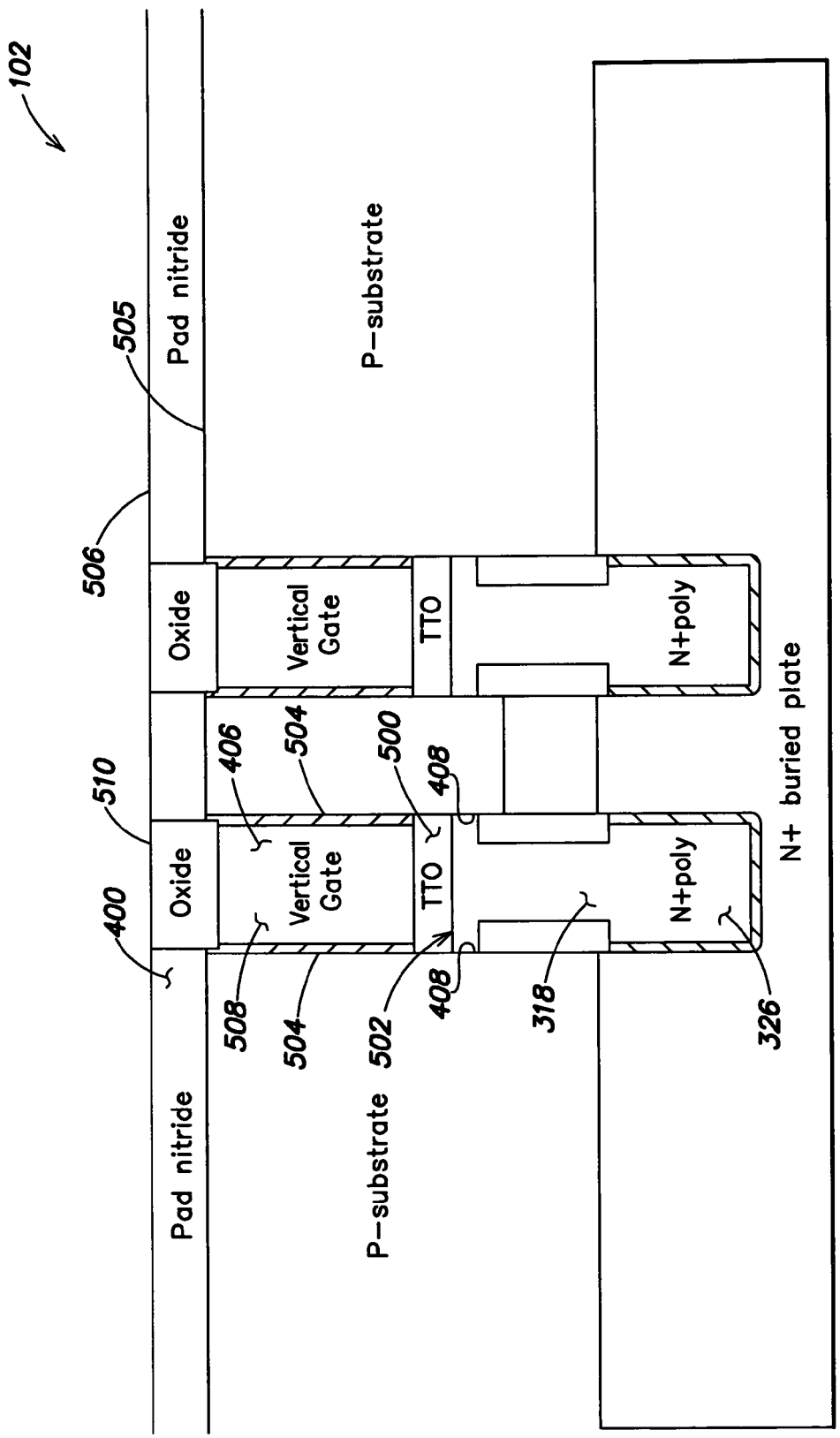
FIG. 5 illustrates a cross-sectional side view of the substrate following a step of the exemplary method of forming the memory cell in which a vertical gate conductor region of a subsequently-formed NFET is formed in accordance with an embodiment of the present invention.

FIG. 5 illustrates a cross-sectional side view of the substrate following a step of the exemplary method of forming the memory cell 100 in which a vertical gate conductor region of a subsequently-formed NFET is formed in accordance with an embodiment of the present invention. With reference to FIG. 5, high-density plasma (HDP) deposition or another suitable method may be employed to form a layer of oxide (e.g., an insulating layer) on a top surface 502 of the n+ polysilicon region 318, thereby forming a trench top oxide (TTO) isolation region 500. The TTO region may be about 5 nm to about 50 nm thick (although a larger or smaller and/or different thickness range may be employed).

One or more portions of an NFET 106 of the memory cell 100 being manufactured may now be formed. For example, thermal oxidation of silicon, thermal nitridation of silicon, CVD of an insulating material, or another suitable method may be employed to form a gate dielectric layer 504 along one or more sidewalls 408 of the upper region 406 of the trench 326. The gate dielectric layer 504 may be formed from one or more of any suitable insulating material and serve as the dielectric region 316 of the memory cell 100.

CVD or another suitable material may be employed to deposit a gate conductor material on the substrate 102 so as to at least fill in the upper region 406 of the trench 326. The gate conductor material may include doped polysilicon, silicide and/or metal (although a larger or smaller number of and/or different materials may be employed). CMP, RIE and/or another suitable method may be employed to remove portions of the gate conductor material. In this manner, the gate conductor material may be recessed to approximately a top surface 505 of silicon near a top surface 506 of the substrate 102, thereby forming a gate conductor material layer 508, which may serve as the gate conductor region 314 of the memory cell 100.

CVD or another suitable method may be employed to deposit oxide or another suitable material on a top surface of the pad nitride layer 400. CMP or another suitable method may be employed to remove portions of the deposited oxide, thereby forming an oxide layer 510. The oxide layer 510 may serve as an oxide cap on the gate conductor material layer 508. The gate conductor material layer 508 may serve as a gate terminal of an NFET subsequently formed in the substrate 102.

Figure 6:
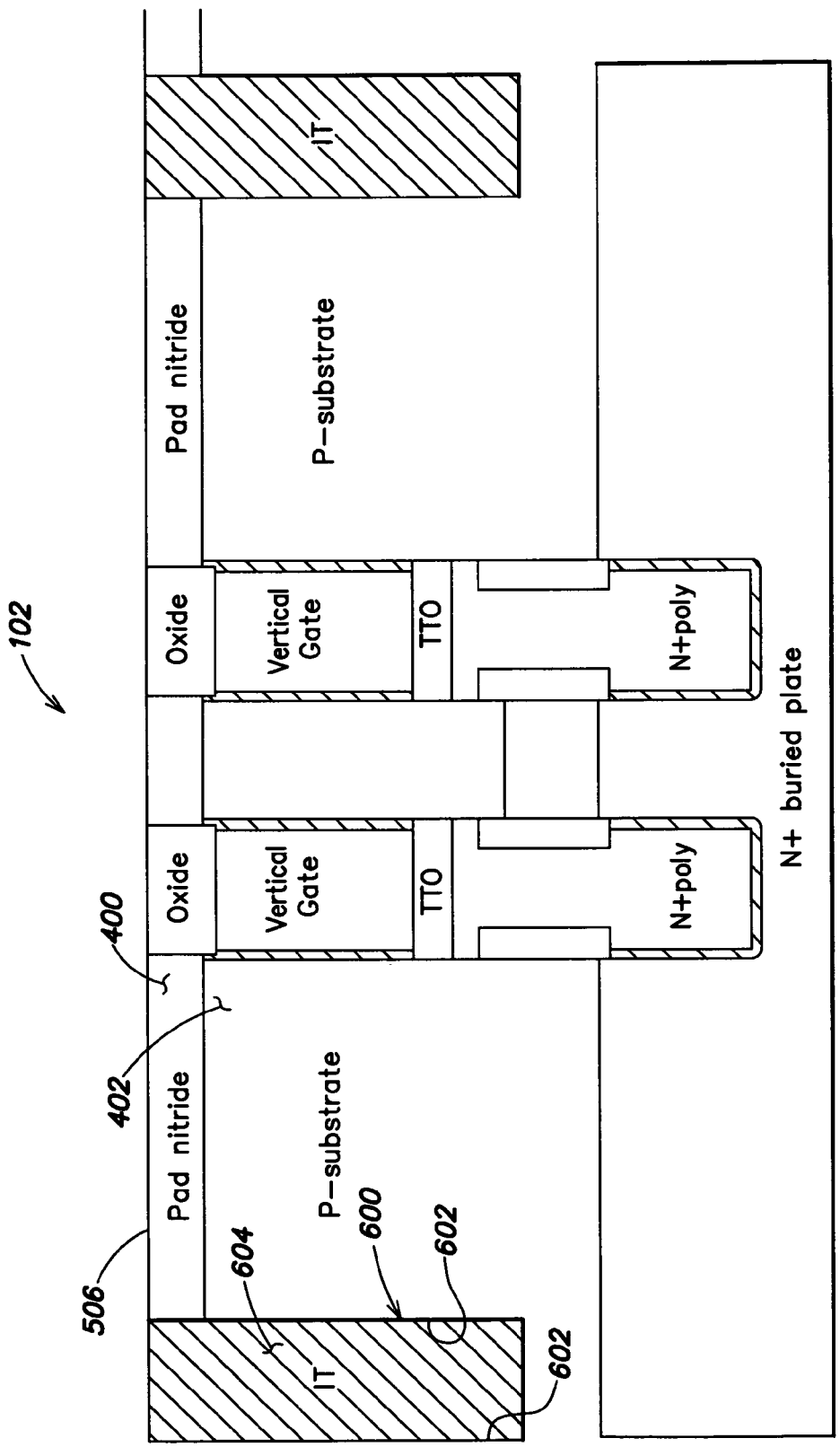
FIG. 6 illustrates a cross-sectional side view of the substrate following a step of the exemplary method of forming the memory cell in which oxide-filled trenches are formed in the substrate in accordance with an embodiment of the present invention.

FIG. 6 illustrates a cross-sectional side view of the substrate following a step of the exemplary method of forming the memory cell in which oxide-filled trenches are formed in the substrate in accordance with an embodiment of the present invention. With reference to FIG. 6, RIE or another suitable method may be employed to remove portions of the pad nitride layer 400 and monocrystalline silicon 402. In this manner, the pad nitride layer 400 may be patterned, and one or more isolation trenches (IT) 600 may be formed in the substrate 102. Once filled with a suitable material (e.g., using CVD followed by CMP), the IT 600 may serve to isolate a memory cell 100 from another adjacent memory cell 100 formed on the substrate 102. The IT 600 may be formed so as to be deeper than an n+ band region (not shown in FIG. 6; 700 in FIG. 7) subsequently formed in the substrate 102. For example, the depth of the IT 600 may be about 0.5 µm to about 3.0 µm (although a larger or smaller and/or different depth range may be employed).

Additionally, in some embodiments, thermal oxidation or another suitable method may be employed to form a layer (e.g., a thin layer) of oxide on one or more sidewalls 602 of the IT 600. Such oxide layer may be about 1 nm to about 10 nm thick (although a larger or smaller and/or different thickness range may be employed). Such oxide layer may serve to heal substrate damage caused by RIE while forming the IT 600. Further, in such embodiments, CVD or another suitable method may be employed to deposit a layer (e.g., a thin layer) of silicon nitride or the like on sidewalls 602 of the IT 600 (e.g., on the previously-deposited oxide layer). Such silicon nitride layer may serve as a barrier which reduces and/or prevents diffusion of material subsequently-deposited in the IT 600 into the IT sidewalls 602. In such embodiments, the silicon nitride layer may be about 2 nm to about 20 nm thick (although a larger or smaller and/or different thickness range may be employed).

HDP or another suitable method may be employed to deposit a layer of oxide on the substrate 102 so as to fill the IT 600 with oxide. CMP or another suitable method may be employed to remove portions of the deposited oxide, thereby forming an oxide layer 604 that is planarized to a top surface 506 of the substrate 102 (e.g., of the pad nitride layer 400 of the substrate 102).

Figure 7:
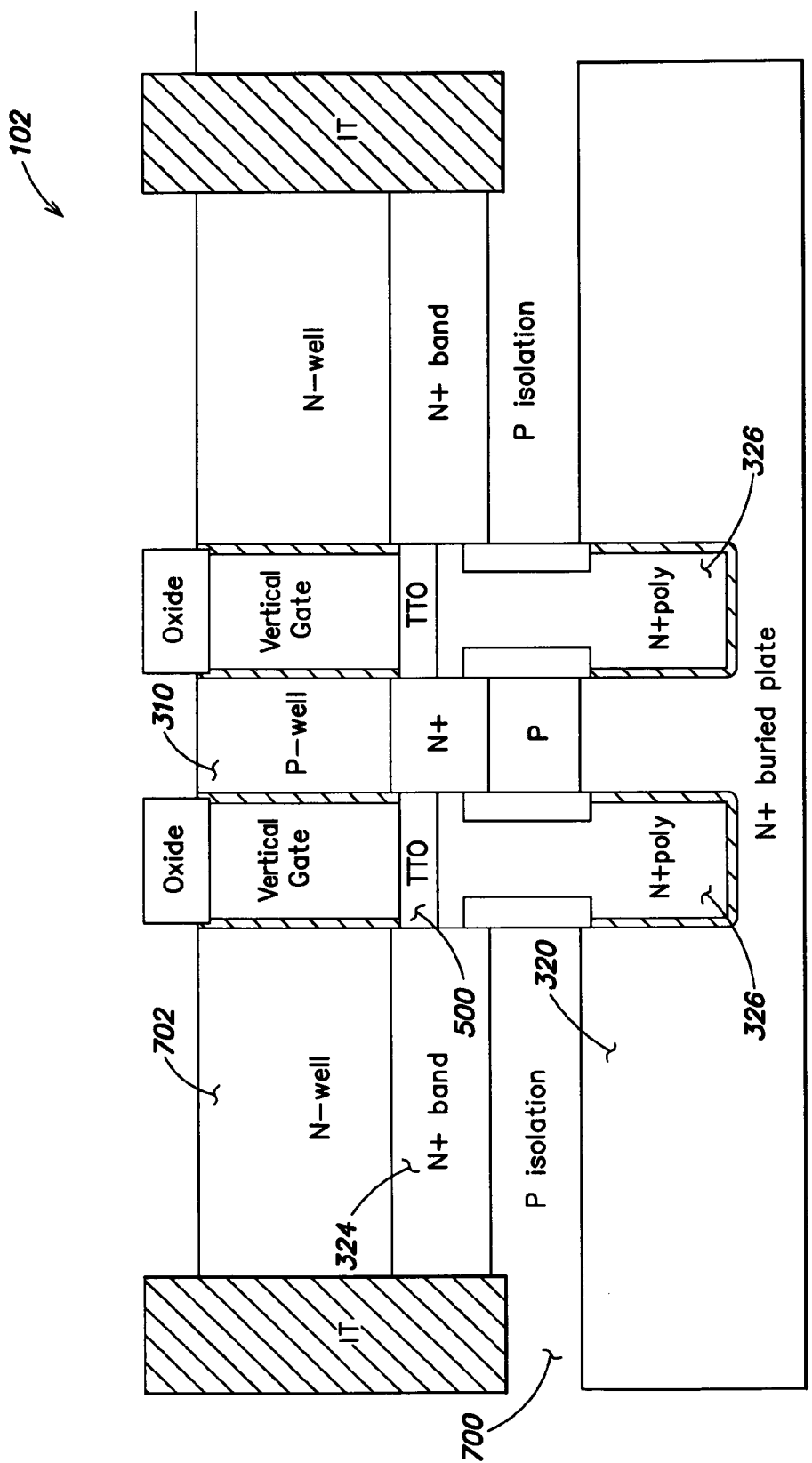
FIG. 7 illustrates a cross-sectional side view of the substrate following a step of the exemplary method of forming the memory cell in which ions are implanted into the substrate in accordance with an embodiment of the present invention.

FIG. 7 illustrates a cross-sectional side view of the substrate following a step of the exemplary method of forming the memory cell in which ions are implanted into the substrate in accordance with an embodiment of the present invention. With reference to FIG. 7, a hot phosphoric acid ethylene glycol mixture or another suitable method may be employed to remove (e.g., strip) the pad nitride layer 400 selective to oxide and silicon. Additionally, in some embodiments, thermal oxidation or another suitable method may be employed to form (e.g., grow) a thin layer of sacrificial oxide on the substrate 102. The sacrificial oxide layer may be about 2 nm to about 10 nm thick (although a larger or smaller and/or different thickness range may be employed). In such embodiments, the sacrificial oxide layer may serve to protect the substrate from damage during subsequent implanting and/or to minimize implant channeling.

The substrate 102 may undergo one or more ion implant processes, which may include one or more implants employed to manufacture vertically-oriented DRAMs. For example, phosphorous, arsenic or another suitable material may be implanted into the substrate 102 so as to form an n+ region or band 324. The n+ region or band 324 may have a peak concentration of about $1 \times 10^{18}$ to about $1 \times 10^{19}$ cm$^{-3}$ and may be centered at about a depth of the TTO region 500. However, a larger or smaller and/or different concentration range may be employed. Additionally or alternatively, the n+ region or band 324 may be implanted deeper or shallower.

Additionally, boron or another suitable material may be implanted into the substrate 102. The boron or another suitable material implant region 700 may have a peak concentration of about $5 \times 10^{17}$ to $5 \times 10^{18}$ cm$^{-3}$ and may be positioned between the n+ region or band 324 and the n+ buried-plate diffusion region 320. However, a larger or smaller and/or different concentration range may be employed. The region of implanted boron or another suitable material may serve as a p isolation region. The p isolation region may serve to shut off a parasitic transistor subsequently formed in the substrate 102.

Further, masking techniques may be employed to implant additional ions into the substrate 102. For example, boron or another suitable material may be implanted into the substrate 102 between adjacent trenches 326 which may include portions of NFETs subsequently formed on the substrate 102, respectively. Such implant may form a p-well region 310 adapted to serve as a transfer channel and set a threshold voltage of an NFET subsequently-formed in the substrate 102. The p-well implant may have a peak concentration between about $2 \times 10^{17}$ to about $2 \times 10^{18}$ cm$^{-3}$ (although a larger or smaller and/or different concentration range may be employed).

In a similar manner, masking techniques may be employed to implant arsenic, phosphorus and/or another suitable material into portions of the substrate 102 except for the area of the substrate 102 in which the p-well region was implanted. Such implant may serve as an n-well region 702 adapted to merge with the n+ region or band 324 so as to establish electrical continuity between such regions. The n-well region 702 implant may have a broad peak concentration between about $4 \times 10^{17}$ to about $5 \times 10^{18}$ cm$^{-3}$ (although a larger or smaller and/or different concentration range may be employed).

Figure 8:
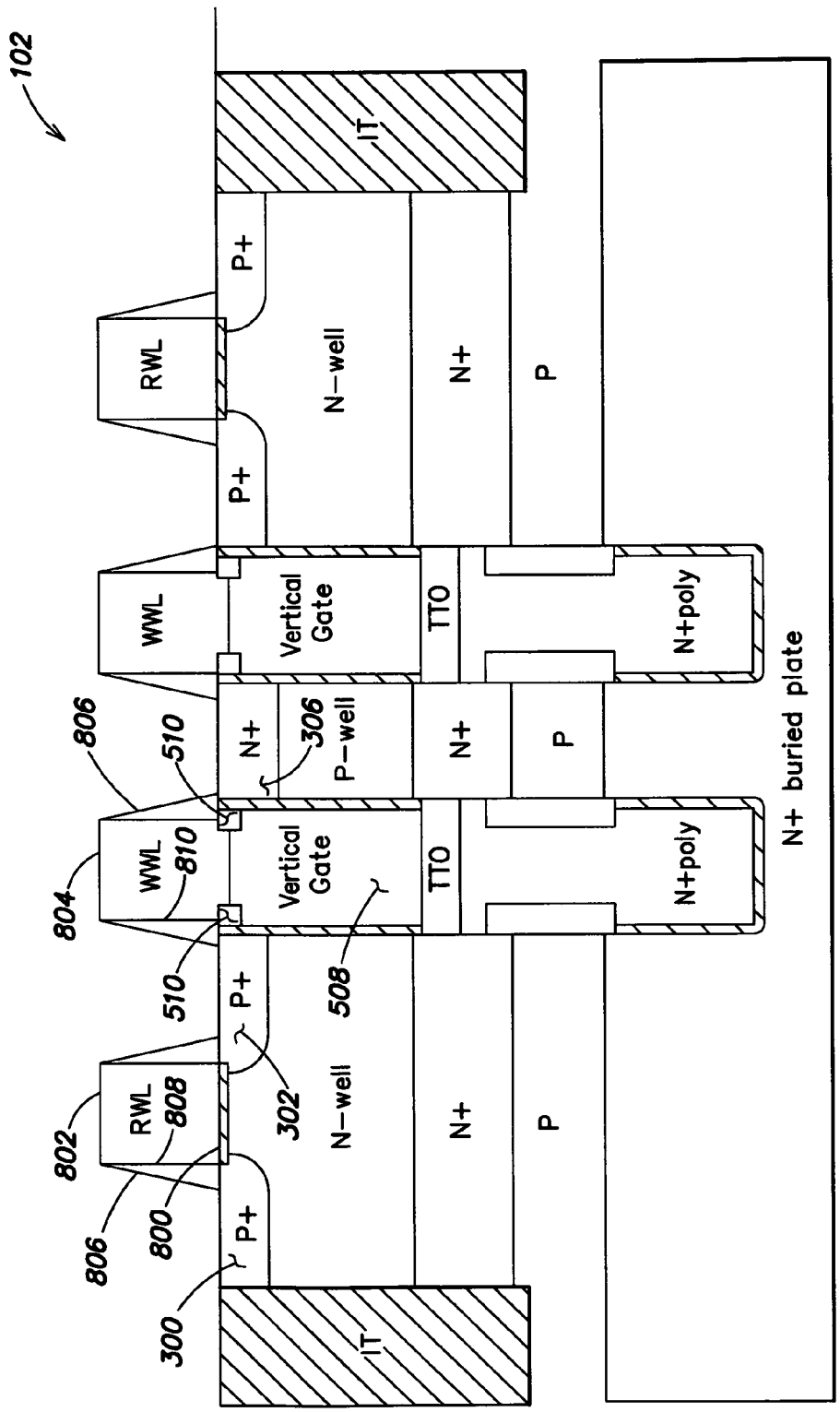
FIG. 8 illustrates a cross-sectional side view of the substrate following a step of the exemplary method of forming the memory cell in which further ions are implanted into the substrate in accordance with an embodiment of the present invention.

FIG. 8 illustrates a cross-sectional side view of the substrate following a step of the exemplary method of forming the memory cell in which further ions are implanted into the substrate in accordance with an embodiment of the present invention. With reference to FIG. 8, methods involving acid, base and/or solvent solutions or another suitable method may be employed to clean a surface of the substrate 102. Thermal oxidation and/or nitridation, CVD or another suitable method may be employed to form a layer of dielectric material that may serve as a gate dielectric 800 for a PFET subsequently formed on the substrate 102.

CVD or another suitable method may be employed to deposit polysilicon, silicide, metal and/or another suitable material, which may serve as a gate conductor for the PFET subsequently formed on the substrate 102. Thereafter, RIE or another suitable material may be employed to remove portions of the deposited gate conductor material to form lines and spaces so that a first word line 802, which may serve as a read word line (RWL) 117, may be formed.

RIE or another suitable method may be employed to remove portions to the oxide layer 510 serving as the oxide cap over the gate conductor material layer 508. In this manner, one or more openings may be formed in the oxide layer 510. ITs 600 formed in the substrate 102 may be protected (e.g., using appropriate masking) while portions of the oxide layer 510 are removed.

CVD or another suitable method may be employed to deposit polysilicon, silicide, metal and/or another suitable conductive material on to the gate conductor material layer 508 for an NFET subsequently formed on the substrate 102. Thereafter, RIE or another suitable method may be employed to remove portions of the deposited conductive material to form lines and spaces so that a second word line 804, which may serve as a write word line (WWL) 132, may be formed.

Thereafter, masking techniques may be employed while implanting ions into the substrate 102 (e.g., into a memory array being manufactured and CMOS support regions included therein). In this manner, source-drain diffusions, N-type halo/extension implants and/or P-type halos/extension implants may be formed in the substrate 102.

CVD or another suitable method followed by RIE or another suitable method may be employed to form a spacer 806 of a dielectric and/or another suitable material on sidewalls 808 of the gate conductor material of RWL 117 and/or sidewalls 810 of the gate conducting material of WWL 132. Masking techniques may be employed while implanting ions into the substrate 102 (e.g., into a memory array being manufactured and CMOS support regions included therein). In this manner, the first and second p+ region 300, 302 of the PFET 104 being manufactured may be formed. The implant to form the first and/or second p+ region 300, 302 may have a peak concentration between about $1\times10^{19}$ to about $1\times10^{20}$ cm$^{-3}$ (although a larger or smaller and/or different concentration range may be employed). Further, the first source/drain diffusion region (e.g., n+ region) 306 of the NFET 106 being manufactured may be formed in this manner. The implant to form the first source/drain n+ diffusion region 306 may have a peak concentration between about $\_1\times10^{19}\_$ to about $\_1\times10^{20}$ cm$^{-3}$ (although a larger or smaller and/or different concentration range may be employed).

At this point in the exemplary method of forming the memory cell, the substrate 102 appears as shown in FIG. 8. To complete the exemplary method and form the memory cell 100 shown in the substrate 102 of FIG. 3, interlevel dielectrics, vias and wiring may be formed on the substrate 102. For example, CVD or another suitable technique may be employed to deposit a layer of glass (e.g., using a Tetraethylorthosilicate (TEOS) precursor, by using a high-density plasma (HDP) deposition, etc.) onto the substrate 102. Thereafter, CMP or another suitable method may be employed to planarize the glass layer.

Further, one or more contact vias and/or ground bus channels may be etched in the substrate 102. CVD or another suitable method may be employed to deposit metal or other suitable conductive material on the substrate 102. CMP or another suitable material may be employed to planarize the deposited material to a top surface of the glass layer. In this manner, one or more contact studs and/or ground buses 340 may be formed.

CVD or another suitable method may be employed to deposit interlayer dielectric material. Thereafter, CMP or another suitable method may be employed to planarize the deposited interlayer dielectric material. In this manner, the RBL 112, the WBL 128 may be formed. A subtractive etch, damascene or another suitable process may be employed to form wiring to bit lines 112, 128 and/or word lines 117, 132. Fabrication of the substrate 102 (e.g., one or more chips thereon) may be completed by forming back end of line (BEOL) wiring and dielectrics.

Figure 9:
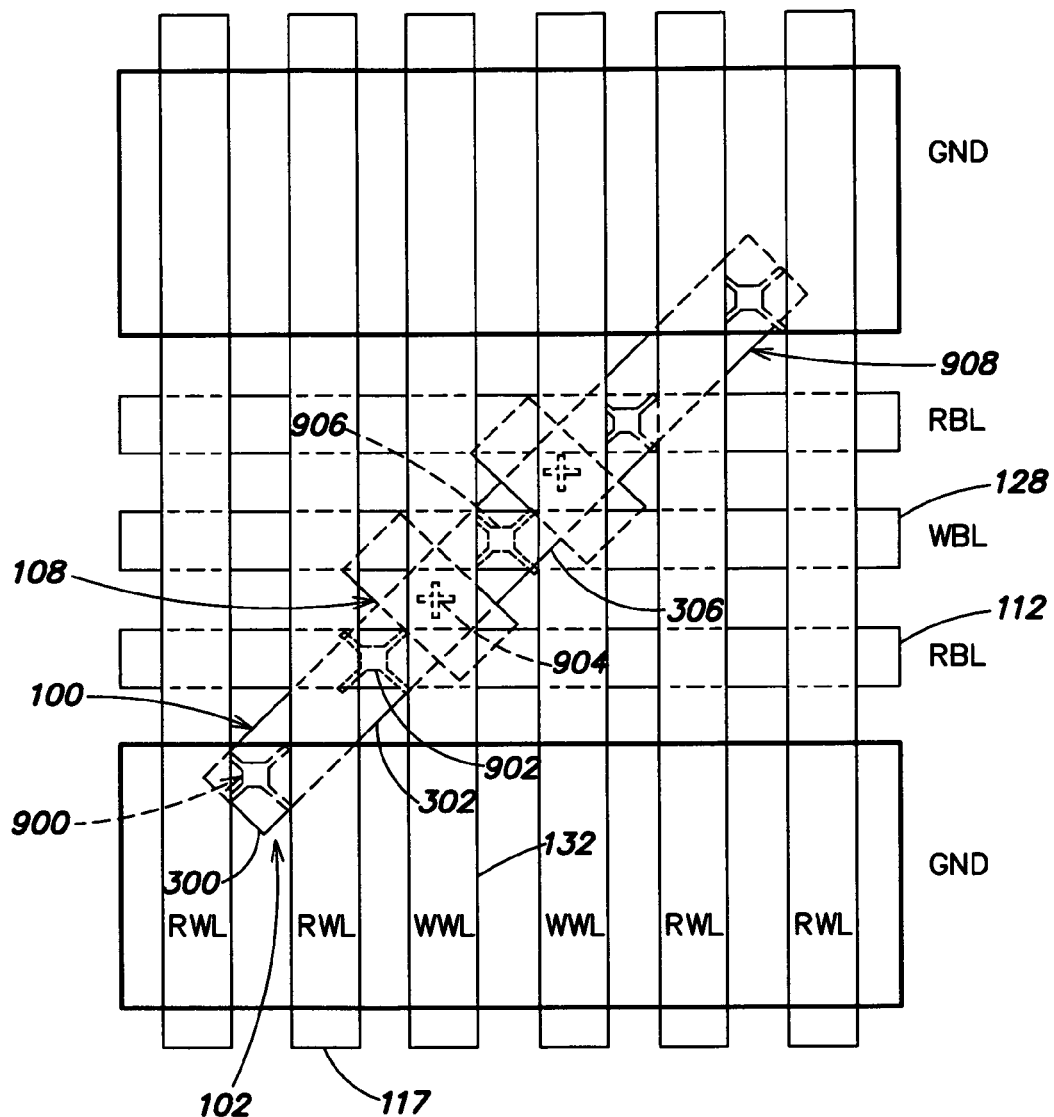
FIG. 9 illustrates a top view of the memory cell formed on a substrate in accordance with an embodiment of the present invention.

FIG. 9 illustrates a top view of the memory cell 100 formed on a substrate in accordance with an embodiment of the present invention. With reference to FIG. 9, a first p+ region 300 of the approximately planar PFET 104, which may serve as a first source/drain diffusion region, may be coupled to a low logic state (e.g., ground) via a first contact 900 (e.g., ground contact). An electrically conductive channel of the approximately planar PFET 104 may couple to the RWL 117. A second p+ region 302 of the PFET 104, which serves as a second source/drain diffusion region, may be coupled to the RBL 112 via a second contact 902.

Further, the gate conductor material layer 508, which serves as a gate terminal 130 of the NFET 106 above the capacitor 108, may couple to the WWL 132 via a third contact 904. The first source/drain diffusion region (e.g., n+ region) 306 of the NFET 106 may couple to the WBL 128 via a fourth contact 906. Although only one memory cell 100 is referred to above, it should be noted that while the exemplary method is employed to manufacture the first memory cell 100, the exemplary method may also manufacture a second memory cell 908 symmetrically.

Figure 10:
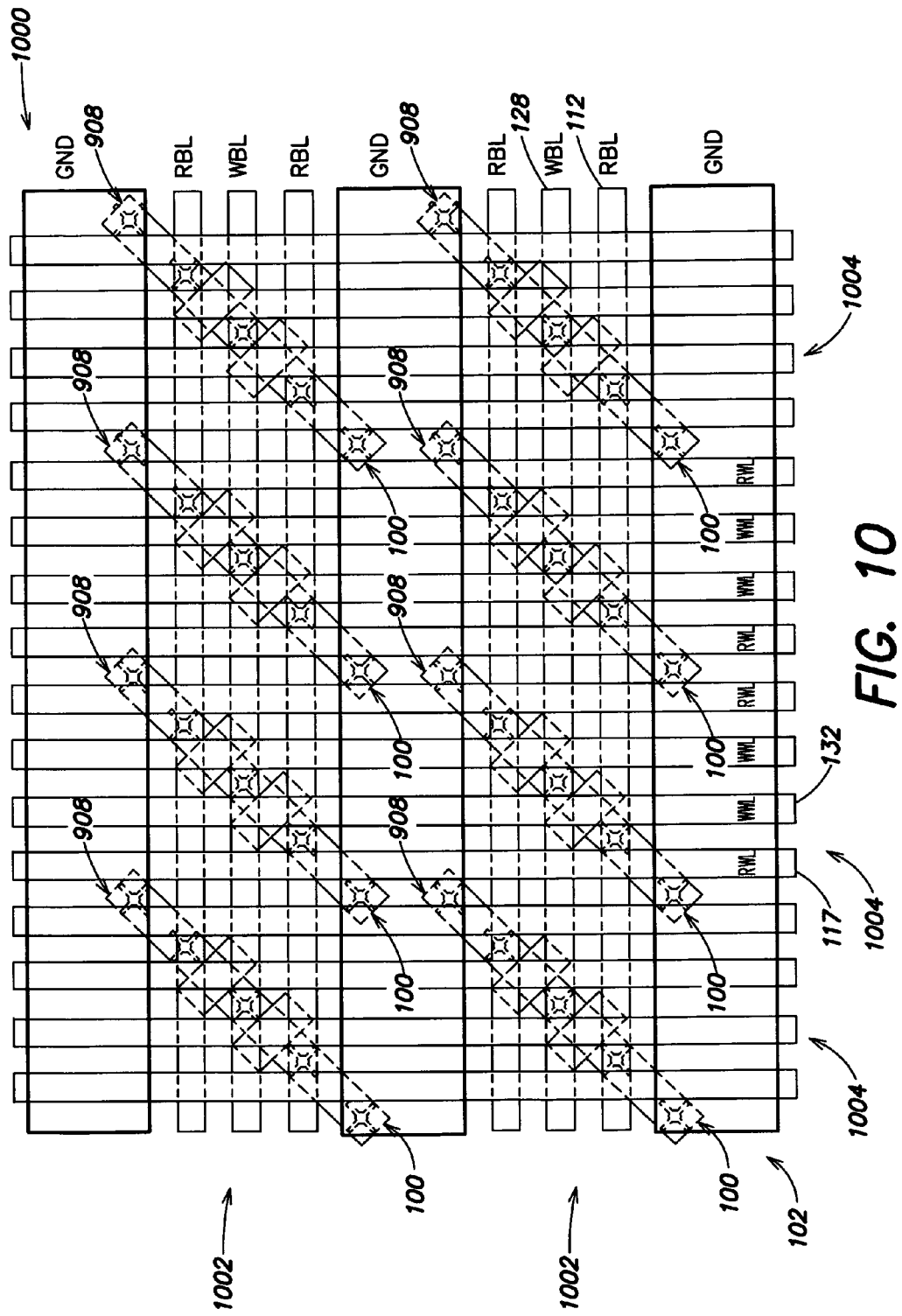
FIG. 10 illustrates a top view of an array including a plurality of the memory cells formed on a substrate in accordance with an embodiment of the present invention.

FIG. 10 illustrates a top view of an array 1000 including a plurality of the memory cells 100, 908 formed on a substrate 102 in accordance with an embodiment of the present invention. With reference to FIG. 10, the array 1000 may include a plurality of the memory cells 100, 908 arranged into rows 1002 and/or columns 1004 (although the memory cells 100, 908 may be arranged in a different manner).

Through use of the exemplary method, a memory cell 100, 908 (e.g., a gain cell) that includes a PFET with an orientation approximately planar to a surface of a substrate and an NFET, which has an orientation approximately perpendicular to the orientation of the PFET (e.g., a vertical orientation), may be formed. The PFET may be employed to read data from the memory cell and the NFET may be employed to write data to the memory cell. Further, the memory cell may include a capacitor. The NFET and capacitor may be formed in a trench (e.g., deep trench) formed in the substrate. The capacitor may be formed in a lower portion of the trench and the NFET may be formed in an upper portion of the trench. A gate of the NFET may be insulated from a node conductor or an electrode (e.g., an n+ polysilicon region 318) of the storage capacitor by a TTO isolation region 500. Further, the exemplary memory cell 100, 908 may include a collar isolation oxide region 410 which lies between an n+ buried plate 320 of the capacitor 108 and a lower source/drain diffusion region (e.g., an n+ region) 308 of the NFET 106. The collar isolation oxide region may prevent parasitic leakage of a charge stored by the capacitor 108.

The exemplary method may manufacture a memory cell 100, 908 such that the WWL 132, which runs into and out of the plane of the cross-sectional view shown FIG. 3, for example, may be coupled the gate 130 of the NFET 106, an upper source/drain diffusion region 306 (e.g., an n+ region) of the NFET 106 may be coupled to the WBL 128 and a lower source/drain diffusion region 308 (e.g., an n+ region) may be coupled to a storage node or electrode (e.g., an n+ polysilicon region 318) of the capacitor 108 through an exposed region or aperture of a sidewall of the trench. Further, the ground bus 340 may couple to a first source/drain diffusion region (e.g., a first p+ region) 300, the RBL 112 may couple to a second source/drain diffusion region (e.g., a second p+ region) 302 and the RWL 117, which runs into and out of the cross-sectional view shown FIG. 3, for example, may serve as a gate terminal of the PFET 104.

Further, the lower source/drain diffusion region 308 of the NFET 106 and a storage node or electrode of the capacitor 108 may be coupled to or integrated with (e.g., electrically coupled) an n-well region 304 of the PFET 104 (e.g., via an n+ band or region 324 below the n-well region 304). Consequently, a back bias of, and therefore, a threshold voltage of the PFET 104 may be based on a voltage stored by the capacitor 108. Thus, a current through the PFET 104 may be sensed to determine a state stored by the capacitor 108.

It should be noted that, as ground rules and/or memory cell cross-sectional areas continue to shrink, conventional memory cells may suffer from insufficient storage capacitance. The present invention provides a memory cell and methods of manufacturing and using such cell which solves the above-described storage capacitance problem. In this manner, the present invention may provide a clear migration option for embedded DRAM with future CMOS technologies (e.g., 65 nm and beyond) so that DRAM may be integrated on a high-performance logic chip. For example, the present invention may provide an improved embedded DRAM cell structure which is scalable to the 45 nm node. More specifically, the present invention addresses the insufficient storage capacitance problem by providing a novel memory cell (e.g., gain cell) adapted to amplify a charge stored on a relatively small capacitance. The memory cell in accordance with an embodiment may include a substantially vertical write NFET formed within a trench including a capacitor that may be integrated with a substantially planar read PFET. The orientation of the PFET, NFET and capacitor may result in a more compact memory element compared to conventional memory elements.

The foregoing description discloses only exemplary embodiments of the invention. Modifications of the above disclosed apparatus and methods which fall within the scope of the invention will be readily apparent to those of ordinary skill in the art. For instance, although the exemplary method of manufacture described above forms two memory cells 100, 908, in other embodiments, the exemplary method may be employed to form a larger or smaller number of memory cells 100, 908.

Accordingly, while the present invention has been disclosed in connection with exemplary embodiments thereof, it should be understood that other embodiments may fall within the spirit and scope of the invention, as defined by the following claims.

The invention claimed is:

1. A memory cell of a substrate that includes a trench, comprising:
   a PFET with an orientation approximately planar to a surface of the substrate; and
   an NFET coupled to the approximately planar PFET, a gate conductor region of the NFET being formed in only an upper region of the trench;
   wherein an orientation of the NFET in the substrate is approximately perpendicular to the orientation of the PFET.

2. The memory cell of claim 1 further comprising a capacitor coupled between the PFET and NFET.

3. The memory cell of claim 2 wherein a portion of the capacitor is formed in a lower region of the trench.

4. The memory cell of claim 3 wherein the trench is about 2 µm to about 6 µm deep.

5. The memory cell of claim 2 wherein a lower source/drain diffusion region of the NFET is electrically coupled to an electrically conductive path of the PFET via the capacitor.

6. The memory cell of claim 2 wherein a back bias of the PFET is based on a voltage stored by the capacitor.

7. The memory cell of claim 2 wherein the capacitor is a substrate-plate trench capacitor.

8. The memory cell of claim 2 wherein the memory cell is adapted to store a value based on a voltage stored by the capacitor.

9. A method of manufacturing a memory cell, comprising:
   providing a substrate;
   forming a trench in the substrate;
   forming a PFET with an orientation approximately planar to a surface of the substrate; and
   forming an NFET coupled to the approximately planar PFET so that a gate conductor region of the NFET is in only an upper region of the trench;
   wherein an orientation of the NFET in the substrate is approximately perpendicular to the orientation of the PFET.

10. The method of claim 9 further comprising forming a capacitor coupled between the PFET and NFET.

11. The method of claim 10 wherein forming a capacitor coupled between the PFET and NFET includes forming a portion of the capacitor in a lower region of the trench.

12. The method of claim 11 wherein forming a trench in the substrate includes forming a trench about 2 µm to about 6 µm in the substrate.

13. The method of claim 10 wherein forming the NFET includes forming a lower source/drain diffusion region of the NFET that is electrically coupled to an electrically conductive path of the PFET via the capacitor of the memory cell.

14. The method of claim 10 wherein forming a capacitor coupled between the PFET and NFET includes forming a capacitor between the PFET and NFET such that a back bias of the PFET is based on a voltage stored by the capacitor of the memory cell.

15. The method of claim 10 wherein forming a capacitor coupled between the PFET and NFET includes forming a substrate-plate trench capacitor.

16. The method of claim 9 wherein forming the NFET with an orientation in the substrate approximately perpendicular to the orientation of the PFET includes reducing an amount of substrate space occupied by the memory cell.

* * * * *